US010686295B2

(12) United States Patent
Mueller et al.

(10) Patent No.: US 10,686,295 B2
(45) Date of Patent: Jun. 16, 2020

(54) LASER COMPONENT AND METHOD OF PRODUCING A LASER COMPONENT

(71) Applicant: OSRAM Opto Semiconductors GmbH, Regensburg (DE)

(72) Inventors: Jens Mueller, Regensburg (DE); Markus Horn, Straubing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 220 days.

(21) Appl. No.: 14/912,210

(22) PCT Filed: Aug. 14, 2014

(86) PCT No.: PCT/EP2014/067441
§ 371 (c)(1),
(2) Date: Feb. 16, 2016

(87) PCT Pub. No.: WO2015/024864
PCT Pub. Date: Feb. 26, 2015

(65) Prior Publication Data
US 2016/0204573 A1 Jul. 14, 2016

(30) Foreign Application Priority Data
Aug. 21, 2013 (DE) .................. 10 2013 216 527

(51) Int. Cl.
*H01S 5/22* (2006.01)
*H01S 5/028* (2006.01)
(Continued)

(52) U.S. Cl.
CPC .............. *H01S 5/22* (2013.01); *H01S 5/0282* (2013.01); *H01S 5/02268* (2013.01);
(Continued)

(58) Field of Classification Search
CPC ............... H01S 5/02252; H01S 5/0224; H01S 5/02469; H01S 3/04; H01S 5/022; H01S 5/02; H01S 5/16; H01S 5/183
(Continued)

(56) References Cited

U.S. PATENT DOCUMENTS 5,521,931 A * 5/1996 Biegelsen ........... H01S 5/02252
372/36
6,136,623 A 10/2000 Hofstetter et al.
(Continued)

FOREIGN PATENT DOCUMENTS

DE 10 2007 060 204 A1 4/2009
DE 10 2009 047 791 A1 3/2011
DE 10 2009 058 345 A1 6/2011

OTHER PUBLICATIONS

Decision on Rejection dated Jun. 11, 2019, of counterpart Chinese Application No. 201480046192.8, in English.
(Continued)

*Primary Examiner* — Tuan N Nguyen
(74) *Attorney, Agent, or Firm* — DLA Piper LLP (US)

(57) ABSTRACT

A laser component includes an edge-emitting first laser chip with an upper side, a lower side, an end side and a side surface, wherein an emission region is arranged on the end side, the side surface is oriented perpendicularly to the upper side and to the end side, a first metallization is arranged on the upper side, a step by which a part adjacent to the upper side of the side surface is set back, is formed on the side surface, a passivation layer is arranged in the set-back part of the side surface, the laser chip is arranged on a carrier, the side surface faces toward a surface of the carrier, and a first solder contact arranged on the surface of the carrier electrically conductively connects to the first metallization.

16 Claims, 6 Drawing Sheets

(51) Int. Cl.
*H01S 5/022* (2006.01)
*H01S 5/042* (2006.01)
*H01S 5/40* (2006.01)
*H01S 5/024* (2006.01)

(52) U.S. Cl.
CPC ...... *H01S 5/02272* (2013.01); *H01S 5/02276* (2013.01); *H01S 5/04254* (2019.08); *H01S 5/02256* (2013.01); *H01S 5/02469* (2013.01); *H01S 5/02484* (2013.01); *H01S 5/4043* (2013.01); *H01S 2301/176* (2013.01)

(58) Field of Classification Search
USPC ..... 438/28; 372/44.01, 50.124; 257/E33.005
See application file for complete search history.

(56) References Cited

U.S. PATENT DOCUMENTS

| | | | | |
|---|---|---|---|---|
| 8,340,146 | B2* | 12/2012 | Lell | H01L 33/44 372/45.01 |
| 9,450,377 | B1* | 9/2016 | Roff | H01S 5/005 |
| 2004/0008747 | A1* | 1/2004 | Nakayama | B82Y 20/00 372/46.013 |
| 2004/0086009 | A1* | 5/2004 | Li | H01S 5/0224 372/36 |
| 2005/0013334 | A1* | 1/2005 | Watanabe | H01S 5/18311 372/44.01 |
| 2006/0273421 | A1* | 12/2006 | Yasuoka | H01L 31/0232 257/438 |
| 2008/0151955 | A1* | 6/2008 | Behfar | H01S 5/22 372/43.01 |
| 2008/0191223 | A1* | 8/2008 | Nakamura | B82Y 20/00 257/95 |
| 2008/0191365 | A1 | 8/2008 | Ueda et al. | |
| 2008/0279241 | A1* | 11/2008 | Oki | B82Y 20/00 372/45.01 |
| 2008/0285610 | A1* | 11/2008 | Hall | C03C 13/048 372/45.011 |
| 2009/0127570 | A1* | 5/2009 | Tamai | B82Y 20/00 257/89 |
| 2009/0267100 | A1* | 10/2009 | Miyake | B82Y 20/00 257/98 |
| 2010/0278203 | A1 | 11/2010 | Lell et al. | |
| 2011/0134948 | A1* | 6/2011 | Kawakami | B82Y 20/00 372/34 |
| 2011/0274131 | A1* | 11/2011 | Takaki | H01S 5/4018 372/50.124 |
| 2012/0106587 | A1* | 5/2012 | Matsuu | B82Y 20/00 372/107 |
| 2012/0189030 | A1* | 7/2012 | Miyoshi | B82Y 20/00 372/45.012 |
| 2012/0287956 | A1 | 11/2012 | Dini et al. | |
| 2014/0204969 | A1* | 7/2014 | Masui | H01S 5/02268 372/45.01 |
| 2016/0111600 | A1* | 4/2016 | Chae | H01L 33/38 257/99 |

OTHER PUBLICATIONS

Decision on Rejection dated Jun. 11, 2019, of counterpart Chinese Application No. 20148046192.8, in English.
First Office Action dated Mar. 5, 2018, of corresponding Chinese Application No. 201480046192.8, along with an English translation.

* cited by examiner

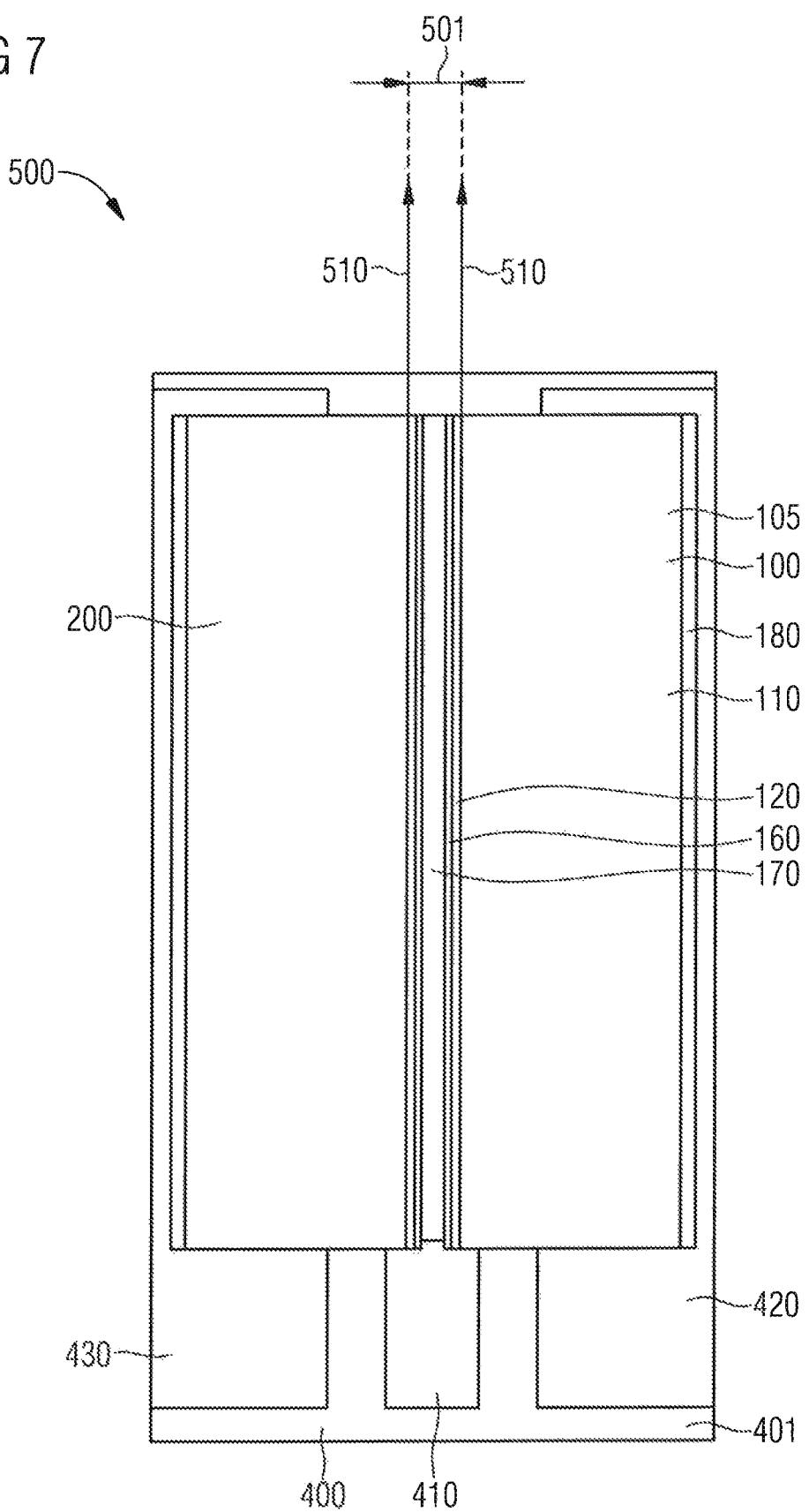

LASER COMPONENT AND METHOD OF PRODUCING A LASER COMPONENT

TECHNICAL FIELD

This disclosure relates to a laser component and a method of producing a laser component.

BACKGROUND

Laser components having semiconductor-based laser chips (laser diodes) are known. In semiconductor-based laser chips, the maximum optical output power, particularly in continuous operation, is essentially limited by two factors. On the one hand, waste heat generated during operation in the laser chip must be dissipated from the laser chip to prevent thermal bending or overrunning of the laser characteristic curve and/or destruction of the laser chip. On the other hand, the optical density occurring on an output facet of the laser chip in the emission region must not exceed a maximum value since, otherwise, optically induced thermal destruction (catastrophic optical damage—COD) may occur. A wide variety of measures to optimize the heat dissipation from the laser chip are known. Furthermore, various possibilities of equipping individual laser chips with a plurality of emitter regions are known.

It could nonetheless be helpful to provide an improved laser component and a method of producing a laser component.

SUMMARY

We provide a laser component including an edge-emitting first laser chip with an upper side, a lower side, an end side and a side surface, wherein an emission region is arranged on the end side, the side surface is oriented perpendicularly to the upper side and to the end side, a first metallization is arranged on the upper side, a step by which a part adjacent to the upper side of the side surface is set back, is formed on the side surface, a passivation layer is arranged in the set-back part of the side surface, the laser chip is arranged on a carrier, the side surface faces toward a surface of the carrier, and a first solder contact arranged on the surface of the carrier electrically conductively connects to the first metallization.

We further provide a method of producing a laser component including providing a wafer having a first laser chip and a second laser chip; applying a trench extending from an upper side of the first laser chip and the second laser chip into the wafer, the trench being arranged between the first laser chip and the second laser chip, and the trench being oriented parallel to a resonator of the first laser chip; arranging a passivation layer in the trench; arranging a first metallization on the upper side of the first laser chip; separating the first laser chip and the second laser chip along a separating plane extending through the trench, side surfaces of the first laser chip and the second laser chip being formed on the separating plane; and arranging the first laser chip on a carrier, the side surface of the first laser chip facing toward a surface of the carrier, a first solder contact arranged on the surface being electrically conductively connected to the first metallization.

BRIEF DESCRIPTION OF THE DRAWINGS

FIG. 7 shows a plan view of the laser component.

Figure 1:
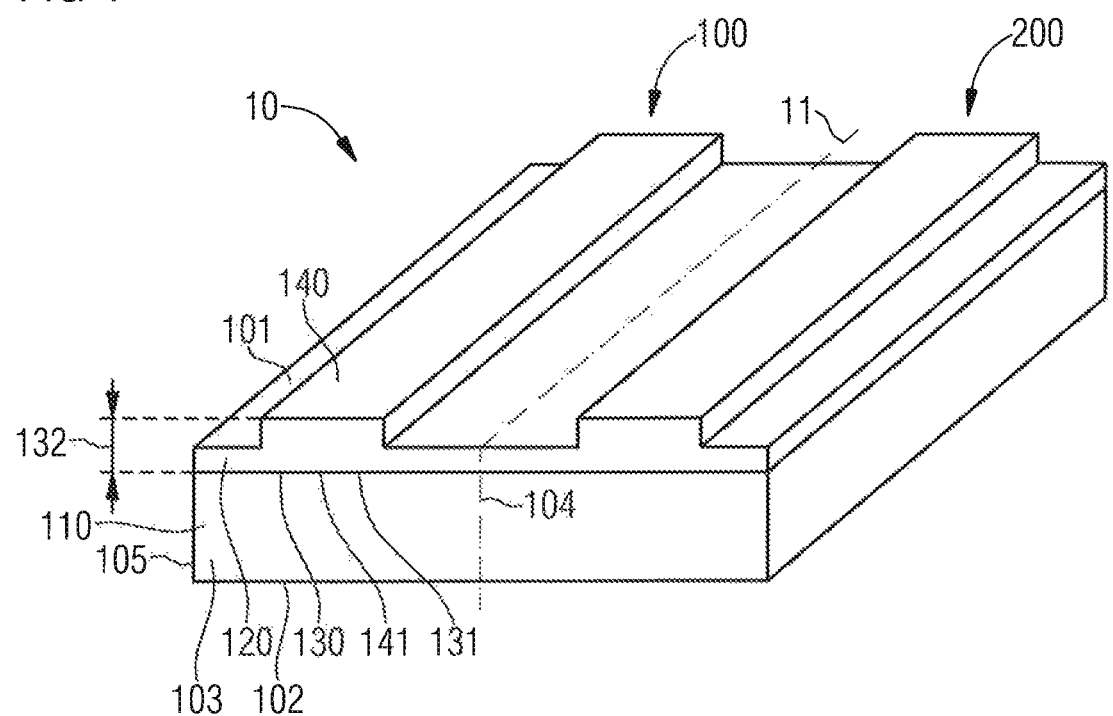
FIG. 1 shows a perspective view of a part of a wafer in a first processing state.

LIST OF REFERENCES 10 wafer
11 separating plane
100 first laser chip
101 upper side
102 lower side
103 end side
104 first side surface
105 second side surface
110 n-doped region
120 p-doped region
130 active region
131 emission region
132 distance
140 waveguide structure
141 resonator
150 trench
151 width
152 depth
153 step
154 set-back part
155 mounting depth
156 mounting width
160 passivation layer
170 first metallization
180 second metallization
190 mounting trench
200 second laser chip
300 third laser chip
400 carrier
401 surface
410 first solder contact
411 width
420 second solder contact
430 third solder contact
500 laser component
501 distance
510 emission direction

DETAILED DESCRIPTION

Our laser component comprises an edge-emitting first laser chip with an upper side, a lower side, an end side and a side surface. An emission region is arranged on the end side of the first laser chip. The side surface is oriented perpendicularly to the upper side and to the end side. A first metallization is arranged on the upper side. A step by which a part, adjacent to the upper side, of the side surface is set back, is formed on the side surface. A passivation layer is arranged in the set-back part of the side surface.

Advantageously, the side surface of the first laser chip may be formed as a fracture surface and therefore have a particularly low surface roughness. For example, the side surface of the first laser chip may have a surface roughness around 50 nm. In this way, the side surface of the first laser chip can be coupled particularly well mechanically and thermally to a surface of a carrier.

The laser chip is arranged on a carrier. In this case, the side surface of the first laser chip faces toward a surface of the carrier. A first solder contact, arranged on the surface of the carrier electrically conductively connects to the first metallization.

Advantageously, in this laser component, waste heat generated in the first laser chip during operation of the laser component is dissipated via the side surface to the carrier. In this way, the waste heat generated in an active region of the first laser chip only has to travel a short distance to the side surface through the first laser chip. There is therefore only a low thermal resistance for the dissipation of the waste heat.

The passivation layer arranged in the set-back part of the side surface advantageously prevents an electrical short circuit between the first solder contact arranged on the surface of the carrier and the side surface of the laser chip. In this way, a short circuit of the laser chip itself is also prevented.

Since the first laser chip is arranged with its side surface on the surface of the carrier, an active region of the first laser chip is advantageously oriented perpendicularly to the surface of the carrier. In this way, a laser beam emitted by the first laser chip of the laser component advantageously has only a small beam divergence in a direction perpendicular to the surface of the carrier. This advantageously makes it possible to arrange the end side of the first laser chip at a certain distance from an outer edge of the carrier of the laser component without the carrier masking the laser beam emitted by the first laser chip. Advantageously, the mounting tolerance during production of the laser component is thereby increased, which allows simple and economical production of the laser component.

The side surface of the first laser chip may connect to the carrier by a second solder contact arranged on the surface of the carrier. Advantageously, an electrical voltage can be applied to the first laser chip of the laser component between the first solder contact and the second solder contact on the surface of the carrier. Since the first solder contact and the second solder contact are arranged in a coplanar fashion on the surface of the carrier, the first laser chip can advantageously be mounted simply and economically on the surface of the carrier by a surface-mount method.

The second solder contact may electrically conductively connect to the lower side of the first laser chip. Advantageously, this gives rise to a large-area electrical connection between the second solder contact of the carrier and the first laser chip so that a low electrical resistance of the electrical connection is ensured.

A second metallization may be arranged on the lower side of the first laser chip. Advantageously, this allows an electrically conductive connection between the second solder contact of the carrier and the first laser chip with a particularly low electrical resistance.

The first metallization may connect the upper side of the first laser chip to an upper side of a second laser chip. Advantageously, the laser component therefore has at least two laser chips so that the laser component can have a particularly high optical output power. In this case, each laser chip of the laser component only needs to deliver a part of the optical output power of the laser component so that the thermal loading of the laser chips and the loading of the laser facets of the laser chips are limited.

The second laser chip may be configured and arranged mirror-symmetrically with respect to the first laser chip. Advantageously, the laser component can therefore be produced particularly simply and economically. Furthermore, the mirror-symmetrical configuration of the first laser chip and the second laser chip leads to a particularly compact example of the laser component.

A distance between the emission region of the first laser chip and an emission region of the second laser chip may be less than 20 µm. In this way, two laser beams emitted by the two laser chips of the laser component can be treated as a single laser beam. This common laser beam can have an optical output power higher than that which would be achievable with only one laser chip. Nevertheless, the laser modes of the laser beams emitted by the two laser chips of the laser component are advantageously not optically coupled so that the first laser chip and the second laser chip of the laser component do not influence one another and can be controlled separately from one another. Loading the emission regions on the output facets of the two laser chips of the laser component is respectively limited despite the high possible optical output power of the laser component so that occurrence of optically induced thermal destruction can be prevented.

A side surface of the second laser chip may connect to the carrier by a third solder contact arranged on the surface of the carrier. Advantageously, the first laser chip and the second laser chip of the laser component can therefore be controlled separately from one another. Owing to the arrangement of the first laser chip and the second laser chip with side surfaces facing toward the surface of the carrier, the bearing area of the laser chip on the surface of the carrier is advantageously less than would be the case with arrangement of the laser chips with the lower sides facing toward the surface of the carrier. This makes it possible to make the carrier from an expensive and therefore highly thermally conductive material.

The distance between the upper side of the first laser chip and the emission region of the first laser chip may be less than 10 µm. Advantageously, this allows a particularly short distance between the emission region of the first laser chip and the emission region of the optional second laser chip of the laser component.

The set-back part of the side surface of the first laser chip may be set back by from 1 µm to 10 µm. For example, the set-back part of the side surface may be set back by 5 µm. Advantageously, a step of this size can be formed with little outlay. At the same time, the offset of the set-back part of the side surface is small enough for the offset to be filled with the material of the first solder contact.

The set-back part of the side surface may extend from the upper side of the first laser chip by from 10 µm to 50 µm in the direction of the lower side of the first laser chip. For example, the set-back part of the side surface may extend from the upper side to a distance of 30 µm in the direction of the lower side of the first laser chip. Advantageously, this value has proven sufficient to ensure reliable electrical separation between the first solder contact and that part of the side surface of the first laser chip which is not setback.

A p-doped region of the first laser chip may be adjacent to the upper side of the first laser chip. An n-doped region of the first laser chip is adjacent to the lower side of the first laser chip. The first laser chip may, however, also be configured such that an n-doped region is adjacent to the upper side and a p-doped region is adjacent to the lower side.

The first solder contact may be arranged on a step formed on the surface of the carrier. Advantageously, even a large offset of the set-back part of the side surface of the first laser chip can be compensated for by the step.

Our method of producing a laser component comprises steps of providing a wafer having a first laser chip and a second laser chip, applying a trench extending from an upper side of the first laser chip and of the second laser chip into the wafer, the trench being arranged between the first laser chip and the second laser chip, the trench being oriented parallel to a resonator of the first laser chip, arranging a passivation layer in the trench, arranging a first metallization on the upper side of the first laser chip, separating the first laser chip and the second laser chip along a separating plane which extends through the trench, side surfaces of the first laser chip and of the second laser chip being formed on the separating plane, and arranging the first laser chip on a carrier, the side surface of the first laser chip facing toward a surface of the carrier, a first solder contact arranged on the surface electrically conductively connected to the first metallization.

Advantageously, this method allows simple and economical production of the laser component. In particular, the method allows parallel production of a multiplicity of laser chips.

The separation of the first laser chip and the second laser chip along the separating plane may, for example, be carried out by fracture in this method. The side surface of the first laser chip is then formed as a fracture surface and can therefore advantageously have a particularly low surface roughness. In this way, the side surface of the first laser chip can advantageously be coupled particularly well mechanically and thermally to the surface of the carrier.

Since the first laser chip is arranged with its side surface on the surface of the carrier in this method, an active region of the first laser chip is advantageously oriented perpendicularly to the surface of the carrier. In this way, a laser beam emitted by the first laser chip of the laser component advantageously has only a small beam divergence in a direction perpendicular to the surface of the carrier. This advantageously makes it possible to arrange the end side of the first laser chip at a certain distance from the outer edge of the carrier of the laser component without the carrier masking the laser beam emitted by the first laser chip. In this way, during the arrangement of the first laser chip, a certain mounting tolerance is advantageously permissible so that the method can be carried out simply and economically.

The method may comprise an additional step of connecting the upper side of the first laser chip to an upper side of the third laser chip by the first metallization. The connection of the upper side of the first laser chip to the upper side of the third laser chip may, for example, be carried out by soldering. In this case, the first metallization on the upper side of the first laser chip may, for example, comprise gold and a metallization on the upper side of the third laser chip may, for example, comprise tin. Advantageously, the laser component which can be obtained by this method has at least two laser chips so that the laser component can have a particularly high optical output power.

The first solder contact may connect to the first metallization by reflow soldering. Production of the electrically conductive connection between the first solder contact and the first metallization advantageously becomes particularly simple and can be automated for mass production.

The above-described properties, features and advantages as well as the way in which they are achieved will become more clearly and comprehensively understandable in connection with the following description of examples, which will be explained in more detail in connection with the drawings.

FIG. 1 shows a schematic perspective representation of a part of a wafer 10. The wafer 10 is produced by the methods of semiconductor technology and has a multiplicity of laser chips in a regular arrangement, of which a first laser chip 100 and a second laser chip 200 are represented in FIG. 1. The wafer 10 and the laser chips 100, 200 may, for example, comprise an InGaN material system.

The laser chips 100, 200 are configured as edge-emitting laser diodes. The first laser chip 100 and the second laser chip 200 are configured mirror-symmetrically with respect to one another. The first laser chip 100 will be explained in more detail below by way of example.

The first laser chip 100 has an upper side 101 and a lower side 102 opposite the upper side 101. The upper sides 101 of the laser chips 100, 200 and the lower sides 102 of the laser chips 100, 200 are part of the upper side and lower side of the wafer 10.

The first laser chip 100 has an n-doped region 110 and a p-doped region 120. The n-doped region 110 is adjacent to the lower side 102 of the first laser chip 100. The p-doped region 120 is adjacent to the upper side 101 of the first laser chip 100. It is, however, possible to interchange the n-doped region 110 and the p-doped region 120 such that the n-doped region 110 is adjacent to the upper side 101 of the first laser chip 100 and the p-doped region 120 is adjacent to the lower side 102 of the first laser chip 100. At the junction between the n-doped region 110 and the p-doped region 120, a two-dimensional p/n junction is formed, which is oriented parallel to the upper side 101 and the lower side 102 of the first laser chip 100.

The p-doped region 120 is structured on the upper side 101 of the first laser chip 100 to form a narrow elongate waveguide structure 140. A part of the p/n junction, arranged in a direction perpendicular to the upper side 101 below the waveguide structure 140, forms an active region 130 of the first laser chip 100.

Besides the upper side 101 and the lower side 102, the first laser chip 100 comprises a first side surface 104 and a second side surface 105. The end side 103 is oriented perpendicularly to the upper side 101 and perpendicularly to the longitudinal direction of the waveguide structure 140. The first side surface 104 and the second side surface 105 lying opposite the first side surface 104 are oriented perpendicularly to the upper side 101, perpendicularly to the end side 103 and parallel to the longitudinal direction of the waveguide structure 140.

On the wafer 10, the end side 103 and the side surfaces 104, 105 of the first laser chip 100 are not exposed but connect to end sides and side surfaces of further laser chips of the wafer 10. In the section of the wafer 10 as shown in FIG. 1, the first side surface 104 of the first laser chip 100 connects to the mirror-symmetrical first side surface of the second laser chip 200. Only in a subsequent processing step are the laser chips 100, 200 of the wafer 10 divided up so that the end sides 103 and the side surfaces 104, 105 are formed. For example, the first laser chip 100 and the second laser chip 200 are separated on a separating plane 11 so that the first side surface 104 of the first laser chip 100 and the mirror-symmetrical first side surface of the second laser chip 200 are exposed.

After individualization of the first laser chip 100, the end side 103 of the first laser chip 100 and a further end side, lying opposite the end side 103, of the first laser chip 100 form mirror facets of the first laser chip 100. A resonator 141 of the first laser chip 100 is formed between the mirror facets. The end side 103 of the first laser chip 100 forms an output facet of the first laser chip 100. A cut region between the active region 130 of the first laser chip 100 and the end side 103 forming the output facet forms an emission region 131 in which a laser beam is emitted during operation of the first laser chip 100. The laser beam is in this case emitted in a direction perpendicular to the end side 103.

The emission region 131 has a distance 132 from the upper side 101 of the first laser chip 100 in a direction perpendicular to the upper side 101 of the first laser chip 100. The distance 132 is preferably less than 10 µm.

Figure 2:
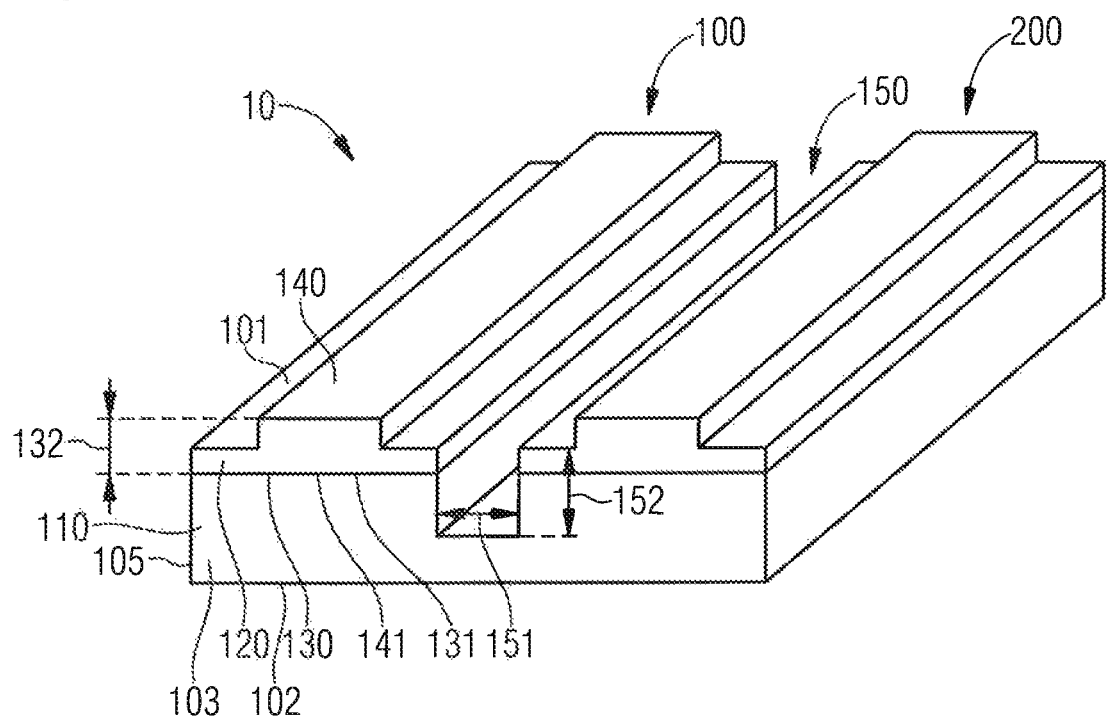
FIG. 2 shows the part of the wafer after application of a trench.

FIG. 2 shows a schematic perspective representation of the wafer 10 in a processing state chronologically following the representation of FIG. 1. A trench 150 has been applied between the first laser chip 100 and the second laser chip 200. The trench 150 extends centrally between the waveguide structures 140 of the first laser chip 100 and the second laser chip 200, and is oriented parallel to the waveguide structures 140 of the laser chips 100, 200. Corresponding further trenches oriented parallel to the trench 150 may be arranged between the laser chips 100, 200 and further laser chips of the wafer 10. The trench 150 may, for example, be applied by an etching process.

The trench 150 extends from the upper side 101 of the first laser chip 100 and of the second laser chip 200 into the first laser chip 100 and the second laser chip 200. In this case, the trench 150 preferably has an approximately rectangular cross section with side walls perpendicular to the upper side 101 of the first laser chip 100 and a bottom surface parallel to the upper side 101 of the first laser chip 100. The trench 150 has a width 151 and a depth 152. The width 151 of the trench 150 is preferably 4 µm to 20 µm. For example, the width 151 of the trench 150 may be 10 µm. The depth 152 of the trench 150 is preferably 10 µm to 50 µm. For example, the trench 150 may have a depth 152 of 30 µm. The trench 150 is so deep that it extends into the n-doped region 110 of the first laser chip 100.

Figure 3:
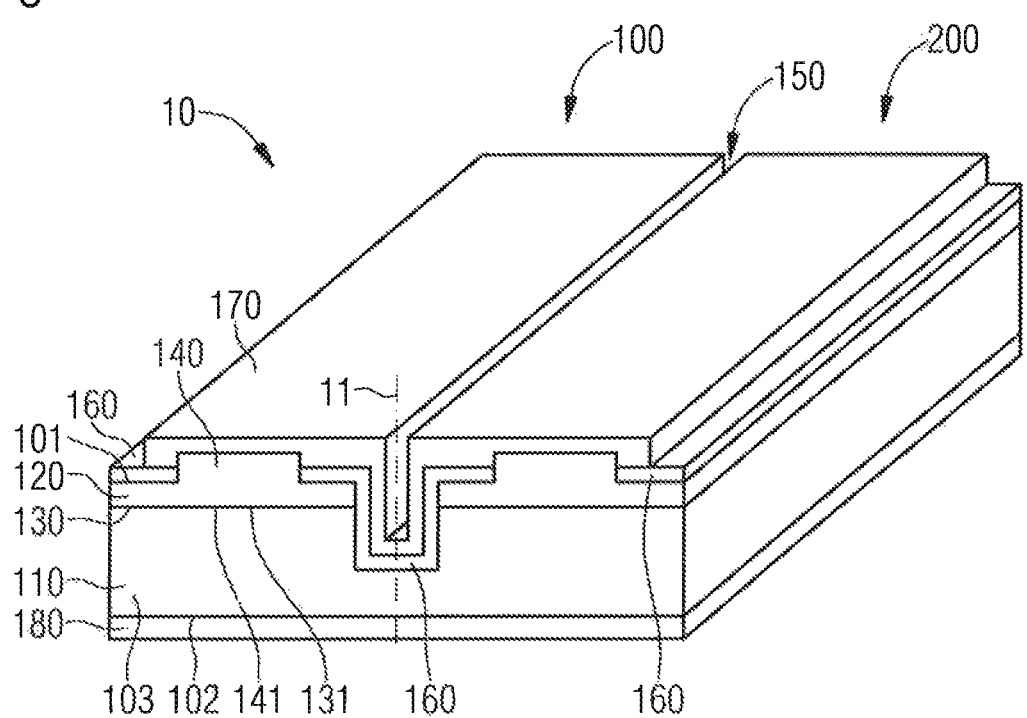
FIG. 3 shows the part of the wafer after application of a passivation layer and a first metallization.

FIG. 3 shows a schematic perspective representation of the wafer 10 in a processing state chronologically following the representation of FIG. 2. A passivation layer 160 and a first metallization 170 have been applied onto the upper sides 101 of the first laser chip 100 and of the second laser chip 200. A second metallization 180 has been applied onto the lower sides 102 of the first laser chip 100 and of the second laser chip 200.

The passivation layer 160 comprises an electrically insulating material. The passivation layer 160 covers the upper side 101 of the first laser chip 100 in the regions surrounding the waveguide structure 140. In the region of the waveguide structure 140, however, the upper side 101 of the first laser chip 100 is not covered by the passivation layer 160. The passivation layer 160 furthermore extends into the trench 150 and covers the side walls and the bottom surface of the trench 150.

The first metallization 170 comprises an electrically conductive material. The first metallization 170 may, for example, comprise gold or tin. On the upper side 101 of the first laser chip 100, the first metallization 170 is arranged on the passivation layer 160, and in the region of the waveguide structure 140 contacts the upper side 101 of the laser chip 100. The first metallization 170 therefore electrically conductively connects in the region of the waveguide structure 140 to the p-doped region 120 of the first laser chip 100. The first metallization 170 furthermore extends into the trench 150 where it lies on the passivation layer 160 at the side walls and the bottom surface of the trench 150. The first metallization 170 is therefore electrically insulated in the region of the trench 150 by the passivation layer 160 from the n-doped region 110 and the p-doped region 120 of the first laser chip.

The second metallization 180 comprises an electrically insulating material. For example, the second metallization 180 may comprise gold. The second metallization 180 covers the lower side 102 of the first laser chip 100 over its surface and therefore electrically conductively contacts the n-doped region 110 of the first laser chip 100. The second metallization 180 may, however, also be omitted.

Figure 4:
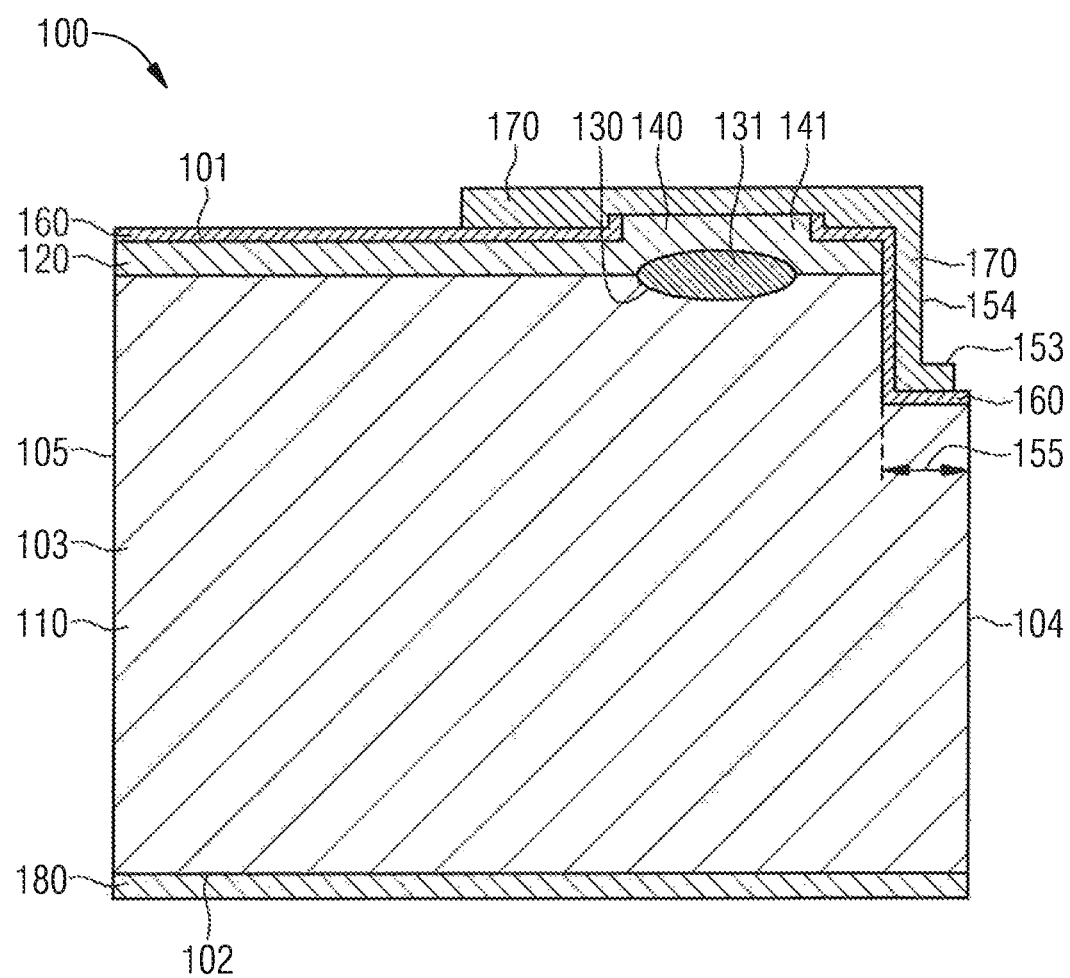
FIG. 4 shows a plan view of an end side of a first laser chip.

FIG. 4 shows a schematic view of the first laser chip 100 after the individualization of the first laser chip 100. The first laser chip 100 has been separated from the second laser chip 200 along the separating plane 11 that runs centrally through the trench 150. Correspondingly, the first laser chip 100 has been separated from further laser chips of the wafer 10 adjacent to the first laser chip 100. The individualization of the first laser chip 100 may, for example, be carried out by fracture. In this case, the side surfaces 104, 105 formed by the individualization of the first laser chip 100 and the end side 103 may be formed very smoothly. Individualization of the laser chip 100 may, for example, also be carried out by sawing the wafer 10.

The trench 150 between the first laser chip 100 and the second laser chip 200 has been divided by the separation of the first laser chip 100 from the second laser chip 200. The half of the trench 150 formed on the first laser chip 100 now forms a step 153 formed on the first side surface 104 of the first laser chip 100. A part, adjacent to the upper side 101 of the first laser chip 100, of the first side surface 104 forms a set-back part 154, which is set back relative to the other parts of the first side surface 104 of the first laser chip 100 by a mounting depth 155. The mounting depth 155 is approximately equal to half the width 151 of the trench 150. For example, the mounting depth 155 may be 5 µm.

Parts of the passivation layer 160 and of the first metallization 170 are arranged in the set-back part 154 of the first side surface 104. In this case, the first metallization 170 is electrically insulated in the set-back part 154 from the n-doped region 110 and the p-doped region 120 of the first laser chip 100 by the passivation layer 160. The first metallization 170, however, electrically conductively connects to the p-doped region 120 of the first laser chip 100 in the region of the waveguide structure 140 on the upper side 101 of the first laser chip 100.

A step that is symmetrical with the step 153 may be formed on the second side surface 105, lying opposite the first side surface 104, of the first laser chip 100. In this case, the second side surface 105 also has a set-back part into which the passivation layer 160 and the first metallization 170 extend. A step on the second side surface 105 is not shown in the representation of FIG. 4 and it may be omitted.

Figure 5:
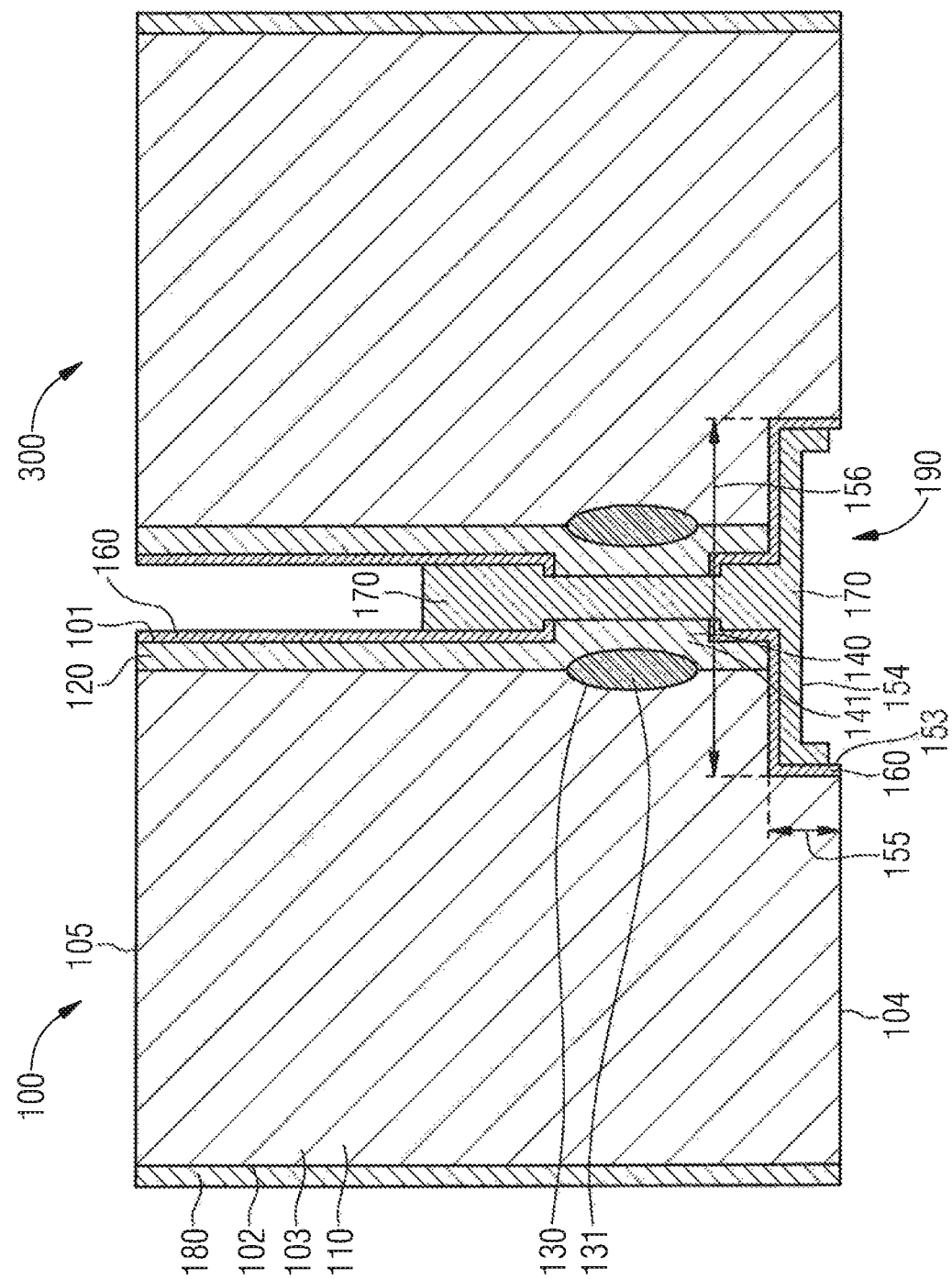
FIG. 5 shows a plan view of the first laser chip and a second laser chip connected to the first laser chip.

FIG. 5 shows a schematic representation of the first laser chip 100 in a processing state chronologically following the representation of FIG. 4. The first laser chip 100 connects to a third laser chip 300, which is essentially configured mirror-symmetrically with respect to the first laser chip 100. The third laser chip 300 may, for example, be formed by the second laser chip 200 adjacent to the first laser chip 100 in the wafer 10. Third laser chip 300 may, however, before another correspondingly configured laser chip. The third laser chip 300 may also come from a different wafer than the first laser chip 100.

The first laser chip 100 and the third laser chip 300 are assembled such that the upper side 101 of the first laser chip 100 lies adjacently opposite the upper side of the third laser chip 300. The waveguide structure 140 of the first laser chip 100 is oriented parallel to the waveguide structure of the third laser chip 300. The first side surface 104 of the first laser chip 100 is, with the greatest possible accuracy, arranged coplanar with the side surface of the third laser chip 300.

The first laser chip 100 connects to the third laser chip 300 by the first metallization 170 arranged on the upper side 101 of the first laser chip 100, being electrically conductively connected to the first metallization of the third laser chip 300, for example, by soldering. The electrically conductive connection between the first metallizations, 170 of the first laser chip 100 and of the third laser chip 300 may, for example, be produced particularly straightforwardly when the first metallization 170 of the first laser chip 100 comprises gold and the first metallization of the third laser chip 300 comprises tin. In this case, the first laser chip 100 and the third laser chip 300 come from different wafers.

The set-back part 154 on the first side surface 104 of the first laser chip 100 ends approximately coplanar with the set-back part of the first side surface of the third laser chip 300. Together, the set-back parts 154 of the first laser chip 100 and of the third laser chip 300 form a mounting trench 190. The first metallizations 170 of the first laser chip 100 and of the third laser chip 300 that electrically conductively connect to one another are accessible in the mounting trench 190.

The mounting trench 190 has, in the direction perpendicular to the first side surface 104 of the first laser chip 100, the mounting depth 155. In a direction perpendicular to the upper side 101 of the first laser chip 100, the mounting trench 190 has a mounting width 156. The mounting depth 156 corresponds approximately to two times the depth 152 of the trench 150 applied in the wafer 10. For example, the mounting width 156 of the mounting trench 190 may be 60 µm.

Figure 6:
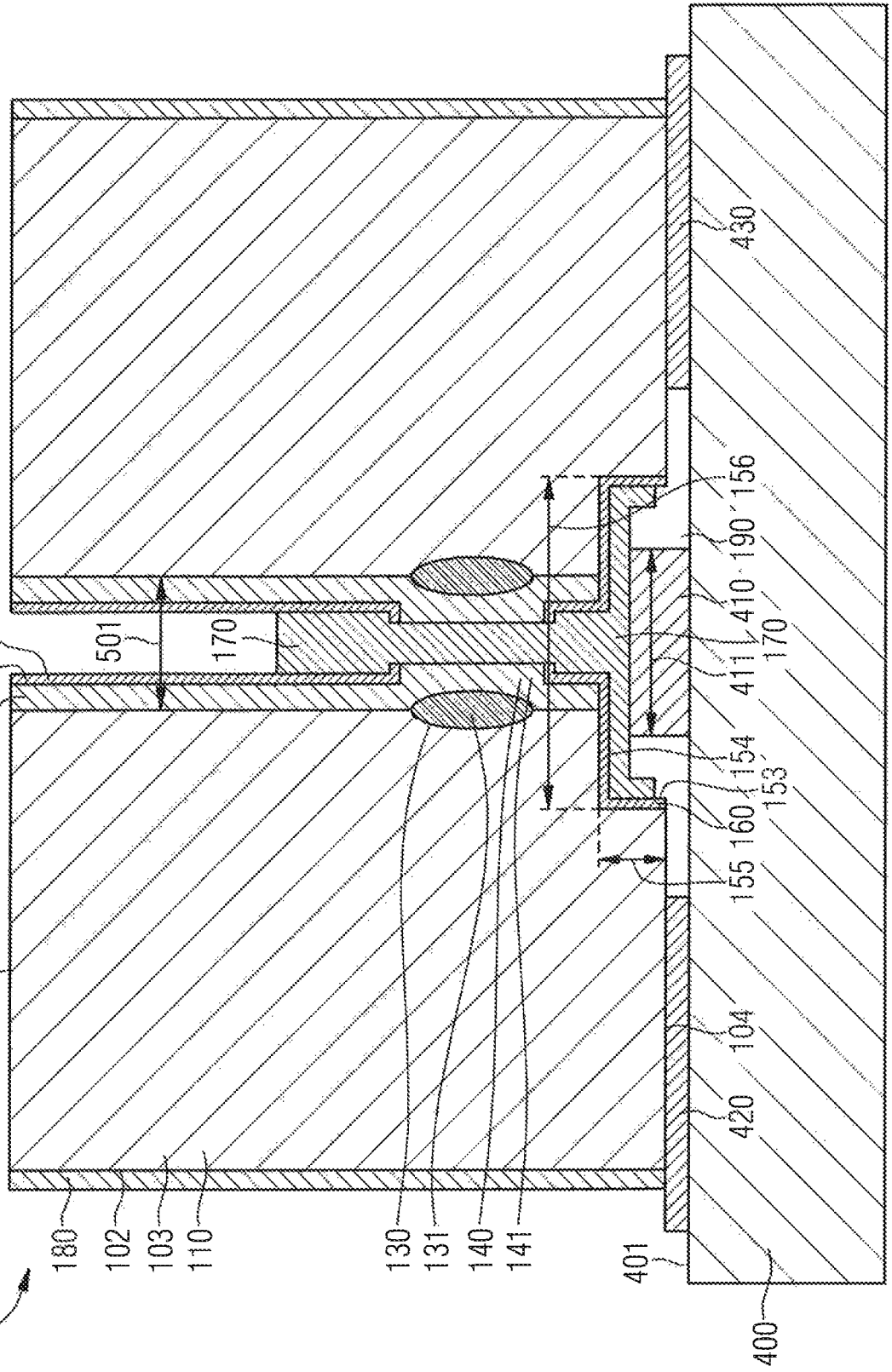
FIG. 6 shows a side view of a laser component.

FIG. 6 shows a side view of a laser component 500. FIG. 7 shows a plan view of the laser component 500.

The laser component 500 comprises the laser chips 100, 300, connected to one another, of FIG. 5. The laser component 500 furthermore comprises a carrier 400. The carrier 400 has a surface 401. The carrier 400 comprises a thermally highly conductive material and is electrically insulating at least on the surface 401. The carrier 400 may, for example, be a metal core printed circuit board. The carrier 400 may, however, also comprise a thermally particularly highly conductive material such as diamond.

A first solder contact 410, a second solder contact 420 and a third solder contact 430 are arranged on the surface 401 of the carrier 400. The solder contacts 410, 420, 430 are respectively electrically insulated from one another. The solder contacts 410, 420, 430 are preferably SMD solder contacts suitable for surface mounting, for example, such as by reflow soldering.

The first solder contact 410 is arranged centrally between the second solder contact 420 and the third solder contact 430. The first solder contact 410 has a width 411. The width 411 is less than the mounting width 156 of the mounting trench 190 of the combination of the first laser chip 100 and the third laser chip 300. For example, the width 411 of the first solder contact 410 is 30 µm. In a direction perpendicular to the connecting direction between the first solder contact 410, the second solder contact 420 and the third solder contact 430, the first solder contact 410, the second solder contact 420 and the third solder contact 430 are strips and have a length corresponding approximately to the length of the side surfaces 104, 105 of the laser chips 100, 300 in a direction parallel to the upper sides 101 of the laser chips 100, 300.

The package formed by the first laser chip 100 and the third laser chip 300 is arranged on the surface 401 of the carrier 400 such that the first side surfaces 104 of the laser chips 100, 300 face toward the surface 401 of the carrier 400. The mounting trench 190 is arranged approximately centered over the first solder contact 410. That part of the first metallization 170 accessible in the mounting trench 190 electrically conductively connects to the first solder contact 410. The connection between the first metallization 170 and the first solder contact 410 may, for example, be produced by a soldering process, for instance by reflow soldering.

Via the first metallization 170, there is an electrically conductive connection between the first solder contact 410 on the surface 401 of the carrier 400 and the p-doped regions 120 of the first laser chip 100 and of the third laser chip 300. The first solder contact 410 is insulated in the region of the mounting trench 190 by the passivation layer 160 of the first laser chip 100 and of the third laser chip 300 from the n-doped regions 110 of the laser chips 100, 300. Since the width 411 of the first solder contact 410 is less than the mounting width 156 of the mounting trench 190 and the mounting trench 190 is arranged approximately centered over the first solder contact 410, there is no electrically conductive connection between the first solder contact 410 and the n-doped regions 110 on the first side surfaces 104 of the laser chips 100, 300 outside the mounting trench 190.

The first side surface 104 of the first laser chip 100 electrically conductively contacts the second solder contact 420 on the surface 401 of the carrier 400. Correspondingly, the first side surface of the third laser chip 300 electrically conductively contacts the third solder contact 430 on the surface 401 of the carrier 400. The connections between the second solder contact 420 and the first side surface 104 of the first laser chip 100 and between the third solder contact 430 and the first side surface of the third laser chip 300 are preferably likewise produced by soldering, for example, reflow soldering.

Via the first side surface 104 of the first laser chip 100, there is an electrically conductive connection between the second solder contact 420 on the surface 401 of the carrier 400 and the n-doped region 110 of the first laser chip 100. Via the first side surface of the third laser chip 300, there is an electrically conductive connection between the third solder contact 430 on the surface 401 of the carrier 400 and the n-doped region of the third laser chip 300. Preferably, there is furthermore a direct electrically conductive connection between the first solder contact 410 and the second metallization 180 on the lower side 102 of the first laser chip 100. Correspondingly, there is preferably also a direct electrically conductive connection between the second metallization on the lower side of the third laser chip 300. In this case, the electrically conductive connections between the solder contacts 420, 430 and the n-doped regions 110 of the laser chips 100, 300 can advantageously be particularly reliable and low-impedance. The second metallization 180 may, however, also be omitted.

Between the first solder contact 410 and the second solder contact 420 of the carrier 400, an electrical voltage can be applied across the active region 130 of the first laser chip 100 to make the first laser chip 100 emit a laser beam. The laser beam is emitted by the first laser chip 100 in the emission region 131 in an emission direction 510 approximately perpendicular to the end side 103. An electrical current in this case flows from the first solder contact 410 via the first metallization 170, the p-doped region 120 in the waveguide structure 140 of the first laser chip 100, the active region 30 of the first laser chip 100 and the n-doped region 110 of the first laser chip 100 to the second solder contact 420 of the carrier 400. Between the first solder contact 410 and the third solder contact 430 of the carrier 400, an electrical voltage can be applied across the active region of the third laser chip 300 to make the third laser chip 300 emit a laser beam. The laser beam is emitted by the third laser chip 300 in the emission region of the third laser chip 300 in an emission direction 510 oriented approximately perpendicularly to the end side of the third laser chip 300. An electrical current in this case flows from the first solder contact 410 through the first metallization 170, the p-doped region in the waveguide structure of the third laser chip 300, via the active region of the third laser chip 300 to the n-doped region of the third laser chip 300 and on to the third solder contact 430 of the carrier 400. The laser component 500 makes it possible to drive the first laser chip 100 and the third laser chip 300 separately from one another.

The emission regions 131 of the first laser chip 100 and of the third laser chip 300 of the laser component 500 have a distance 501 from one another. The distance 501 between the emission regions 131 corresponds approximately to the sum of two times the distance 132 of the emission region 131 of the first laser chip 100 from the upper side 101 of the first laser chip 100 and the thickness of the two first metallizations 170 of the laser chips 100, 300. The distance 501 of the emission regions 131 is preferably less than 20 µm.

The short distance 501 between the emission regions 131 of the laser chips 100, 300 of the laser component 500 advantageously makes it possible to treat the laser beams emitted by the two laser chips 100, 300 of the laser component 500 optically as a common laser beam. To this end, for example, the laser component 500 may have suitable common optics for the two laser beams emitted by the laser chips 100, 300.

Despite their short distance 501, the laser beams emitted by the two laser chips 100, 300 of the laser component 500 are not optically coupled. This means that the active regions 130 and the resonators 141 of the laser chips 100, 300 and the laser beams emitted by the laser chips 100, 300 do not influence one another.

The laser beam formed by optically combining the laser beams emitted by the laser chips 100, 300 of the laser component 500 can have a high optical output power. Yet, since the elementary beams emitted by the laser chips 100, 300 are emitted at mutually separated emission regions 131 of the laser chips 100, 300, the facet loading at the emission regions 131 of the first laser chip 100 and of the third laser chip 300 is low so that there is only a low risk of optically induced thermal destruction.

Waste heat generated in the first laser chip 100 and the third laser chip 300 during operation of the laser component 500 can flow away from the active regions 130 of the laser chips 100, 300 via the first side surfaces 104 of the laser chips 100, 300 into the carrier 400. In this case, the waste heat advantageously only has to travel the short distance between the active regions 130 and the first side surfaces 104 of the laser chips 100, 300 so that there is only a low thermal resistance for the heat flowing away.

The laser beams emitted by the laser chips 100, 300 of the laser component 500 have a smaller beam divergence in a direction perpendicular to the surface 401 of the carrier 400 than in a direction parallel to the surface 401 of the carrier 400. For example, the laser beams emitted by the laser chips 100, 300 may have a beam divergence of 8° in a direction perpendicular to the surface 401 of the carrier 400 and a beam divergence of 22° in a direction parallel to the surface 401 of the carrier 400. The small beam divergence of the laser beams emitted by the laser chips 100, 300 in a direction perpendicular to the surface 401 of the carrier 400 allows the end sides 103 of the laser chips 100, 300 of the laser component 500 to be arranged set back relative to an edge of the carrier 400, without masking of the laser beams emitted by the laser chips 100, 300 taking place at the edge of the carrier 400. This advantageously produces a certain mounting tolerance in the arrangement of the package of the laser chips 100, 300 on the surface 401 of the carrier 400.

Since the first side surfaces 104 of the laser chips 100, 300 of the laser component 500 may be produced by fracture during division of the wafer 10, the first side surfaces 104 of the laser chips 100, 300 can have a particularly low surface roughness. For example, the first side surfaces 104 of the laser chips 100, 300 may have a surface roughness of around 50 nm. In this way, the arrangement of the first side surfaces 104 of the laser chips 100, 300 on the surface 401 of the carrier 400 is particularly simple and good thermal and electrical contacts are obtained between the side surfaces 104 of the laser chips 100, 300 and the solder contacts 420, 430 on the surface 401 of the carrier 400.

Another advantage of the arrangement of the laser chips 100, 300 of the laser component 500 is that the laser chips 100, 300 have a smaller spatial requirement on the surface 401 of the carrier 400 than an arrangement of the laser chips 100, 300 in which the upper sides 101 or the lower sides 102 of the laser chips 100, 300 face toward the surface 401 of the carrier 400. This allows the laser component 500 to be configured particularly compactly. Furthermore, the carrier 400 of the laser component 500 can therefore be configured with a particularly small surface 401 that allows the carrier 400 to be made from an expensive material.

It is possible to provide a step on the surface 401 of the carrier 400. In this case, the first solder contact 410 is arranged on the surface of the step and therefore significantly higher in a direction perpendicular to the surface 401 of the carrier 400 than the second solder contact 420 and the third solder contact 430. In this case, the mounting depth 155 may, for example, have a value of 10 µm to 100 µm.

Our components and methods have been illustrated and described in detail with the aid of the preferred examples. This disclosure is nevertheless not restricted to the examples disclosed. Rather, other variants may be derived therefrom by those skilled in the art, without departing from the protective scope of the appended claims.

This application claims the priority of DE 10 2013 216 527.7, the contents of which are incorporated herein by reference.

The invention claimed is:

1. A method of producing a laser component comprising providing a wafer having a first laser chip and a second laser chip;
    applying a trench extending from an upper side of the first laser chip and the second laser chip into the wafer, the trench being arranged between the first laser chip and the second laser chip,
    the trench being oriented parallel to a resonator of the first laser chip; and
    arranging a passivation layer in the trench;
    arranging a first metallization on the upper side of the first laser chip;
    separating the first laser chip and the second laser chip along a separating plane extending through the trench, side surfaces of the first laser chip and the second laser chip being formed on the separating plane; and arranging the first laser chip on a surface of a carrier, the side surface of the first laser chip facing toward the surface of the carrier, a first solder contact arranged on the surface of the carrier being electrically conductively connected to the first metallization.

2. The method as claimed in claim 1, further comprising connecting the upper side of the first laser chip to an upper side of a third laser chip by the first metallization.

3. The method as claimed in claim 1, wherein the first solder contact connects to the first metallization by reflow soldering.

4. A laser component comprising
an edge-emitting first laser chip with an upper side, a lower side, an end side and a side surface, wherein the side surface is oriented perpendicularly to the upper side and to the end side:
an emission region is arranged on the end side;
a first metallization is arranged on the upper side;
a step by which a part adjacent to the upper side of the side surface is set back, is formed on the side surface;
a passivation layer is arranged in the set-back part of the side surface;
the edge-emitting first laser chip is arranged on a surface of a carrier, wherein the side surface faces toward the surface of the carrier; and
a first solder contact arranged on the surface of the carrier electrically conductively connects to the first metallization.

5. The laser component as claimed in claim 4, wherein the side surface of the edge-emitting first laser chip connects to the carrier by a second solder contact arranged on the surface of the carrier.

6. The laser component as claimed in claim 5, wherein the second solder contact electrically conductively connects to the lower side of the edge-emitting first laser chip.

7. The laser component as claimed in claim 4, wherein a second metallization is arranged on the lower side of the edge-emitting first laser chip.

8. The laser component as claimed in claim 4, wherein the first metallization connects the upper side of the edge-emitting first laser chip to an upper side of a second laser chip.

9. The laser component as claimed in claim 8, wherein the second laser chip is configured and arranged mirror-symmetrically with respect to the edge-emitting first laser chip.

10. The laser component as claimed in claim 8, wherein a side surface of the second laser chip connects to the carrier by a third solder contact arranged on the surface of the carrier.

11. The laser component as claimed in claim 4, wherein a distance between the upper side and the emission region is less than 10 μm.

12. The laser component as claimed in claim 4, wherein the set-back part of the side surface is set back by 1 μm to 10 μm.

13. The laser component as claimed in claim 4, wherein the set-back part of the side surface extends from the upper side of the edge-emitting first laser chip by 10 μm to 50 μm in the direction of the lower side of the edge-emitting first laser chip.

14. The laser component as claimed in claim 4, wherein a p-doped region of the edge-emitting first laser chip is adjacent to the upper side, and
an n-doped region of the edge-emitting first laser chip is adjacent to the lower side.

15. The laser component as claimed in claim 4, wherein the first solder contact is arranged on a step formed on the surface of the carrier.

16. A laser component comprising
an edge-emitting first laser chip with an upper side, a lower side, an end side and a side surface, wherein the side surface is oriented perpendicularly to the upper side and to the end side;
an emission region is arranged on the end side;
a first metallization is arranged on the upper side;
a step by which a part adjacent to the upper side of the side surface is set back, is formed on the side surface;
a passivation layer is arranged in the set-back part of the side surface;
the edge-emitting first laser chip is arranged on a surface of a carrier, wherein the side surface faces toward the surface of the carrier;
a first solder contact arranged on the surface of the carrier electrically conductively connects to the first metallization;
the first metallization connects the upper side of the edge-emitting first laser chip to an upper side of a second laser chip; and
a distance between the emission region of the edge-emitting first laser chip and an emission region of the second laser chip is less than 20 μm.

* * * * *